(12) United States Patent
Yamazaki et al.

(10) Patent No.: US 7,867,920 B2
(45) Date of Patent: Jan. 11, 2011

(54) METHOD FOR MODIFYING HIGH-K DIELECTRIC THIN FILM AND SEMICONDUCTOR DEVICE

(75) Inventors: Kazuyoshi Yamazaki, Nirasaki (JP); Shintaro Aoyama, Nirasaki (JP); Koji Akiyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 231 days.

(21) Appl. No.: 12/097,888

(22) PCT Filed: Nov. 22, 2006

(86) PCT No.: PCT/JP2006/323323

§ 371 (c)(1),
(2), (4) Date: Jun. 18, 2008

(87) PCT Pub. No.: WO2007/072649

PCT Pub. Date: Jun. 28, 2007

(65) Prior Publication Data

US 2009/0302433 A1 Dec. 10, 2009

(30) Foreign Application Priority Data

Dec. 20, 2005 (JP) .............................. 2005-367176
Aug. 1, 2006 (JP) .............................. 2006-209945

(51) Int. Cl.
H01L 21/31 (2006.01)
H01L 21/469 (2006.01)

(52) U.S. Cl. ..................... 438/787; 438/788; 438/791; 438/680; 438/792; 257/E21.17; 257/E21.054; 257/E21.077; 257/E21.134; 257/E21.242; 257/E21.259; 257/E21.267; 257/E21.311; 257/E21.318; 257/E21.319; 257/E21.324

(58) Field of Classification Search ................. 438/787, 438/788, 791, 792, 769, 680, 681, 513, 474, 438/475, 775; 257/E21.17, 54, 77, 134, 242, 257/259, 267, 311, 318, 319, 324
See application file for complete search history.

(56) References Cited

U.S. PATENT DOCUMENTS 7,125,799 B2 * 10/2006 Aoyama et al. ............. 438/677

(Continued)

FOREIGN PATENT DOCUMENTS

JP 2001-230247 8/2001

(Continued)

OTHER PUBLICATIONS

Korean Office Action mail date Jun. 24, 2010.

*Primary Examiner*—David Nhu
(74) *Attorney, Agent, or Firm*—Oblon, Spivak, McClelland, Maier & Neustadt, L.L.P.

(57) ABSTRACT

There is provided a method for modifying a high-k dielectric thin film provided on the surface of an object using a metal organic compound material. The method includes a preparation process for providing the object with the high-k dielectric thin film formed on the surface thereof, and a modification process for applying UV rays to the highly dielectric thin film in an inert gas atmosphere while maintaining the object at a predetermined temperature to modify the high-k dielectric thin film. According to the above constitution, the carbon component can be eliminated from the high-k dielectric thin film, and the whole material can be thermally shrunk to improve the density, whereby the occurrence of defects can be prevented and the film density can be improved to enhance the specific permittivity and thus to provide a high level of electric properties.

20 Claims, 14 Drawing Sheets

U.S. PATENT DOCUMENTS

| | | | |
|---|---|---|---|
| 7,163,719 B2 * | 1/2007 | Park et al. | 427/255.29 |
| 7,508,648 B2 * | 3/2009 | Ahn et al. | 361/311 |
| 7,601,649 B2 * | 10/2009 | Ahn et al. | 438/778 |
| 2005/0250346 A1 * | 11/2005 | Schmitt | 438/778 |

FOREIGN PATENT DOCUMENTS

| | | |
|---|---|---|
| JP | 2001 316820 | 11/2001 |
| JP | 2002 57155 | 2/2002 |
| JP | 2002 299607 | 10/2002 |
| KR | 10-398495 | 9/2001 |

* cited by examiner

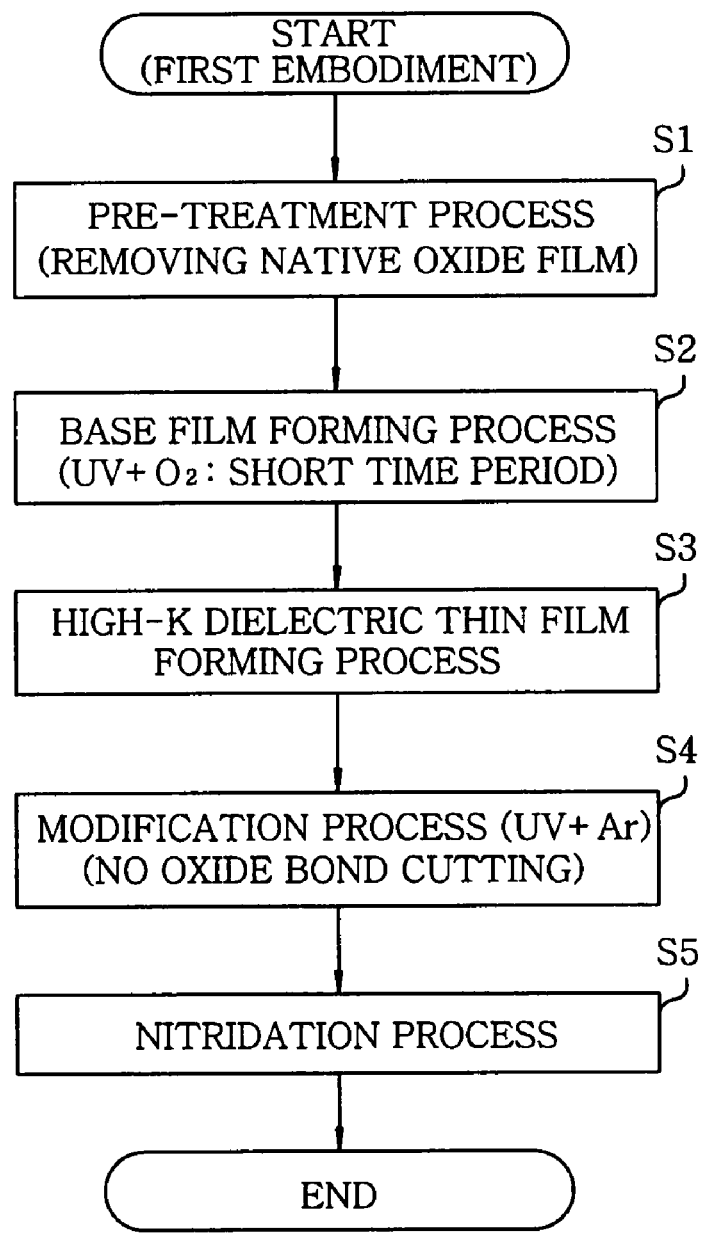

METHOD FOR MODIFYING HIGH-K DIELECTRIC THIN FILM AND SEMICONDUCTOR DEVICE

FIELD OF THE INVENTION

The present invention relates to a method for modifying a high-k dielectric thin film formed on a target object such as a semiconductor wafer and the like, and a semiconductor device using a gate insulating film obtained by the modification.

BACKGROUND OF THE INVENTION

In general, in a manufacturing process of a semiconductor integrated circuit, various single-substrate processes such as a film forming process, an etching process, a heat treatment process, a modification process and a crystallization process are repeated on a target object such as a semiconductor wafer to form the desired integrated circuit.

With the recent trend of thin-film integrated circuits featuring a high operation speed and high integration, the line width and film thickness of the integrated circuit become smaller. For example, in case of a semiconductor device of a semiconductor integrated circuit, e.g. a transistor, it is required to further reduce the width of the gate insulating film as well as to further decrease the thickness of a gate insulating film of the transistor to meet the miniaturization requirement. To be specific, it is necessary to set the thickness of the gate insulating film to 1 to 2 nm or smaller. However, in such an extremely thin gate insulating film, a tunneling current is increased, which in turn increases a gate leakage current.

For this, a high-k dielectric thin film having a much higher dielectric constant than $SiO_2$ tends to be used as the gate insulating film instead of a $SiO_2$ film (for example, see Japanese Patent Laid-open Publication Nos. 2002-100627 and H20-135233). The high dielectric thin film may be formed of refractory metal oxide such as $HfO_2$, $HfSiO_2$, $ZrO_2$, $ZrSiO_2$ or the like.

In case of a gate insulating film formed by coating a high-k dielectric thin film directly on a silicon substrate or film, metal elements in the high-k dielectric film tend to diffuse into the silicon substrate or film to thereby cause a carrier scattering problem in a channel region. In order to prevent diffusion of the metal elements, a thin $SiO_2$ film with a thickness of, e.g., several Å ($1Å=10^{-10}$ m) is formed under the high-k dielectric thin film as a base film. The $SiO_2$ film serving as the base film is much thinner than a $SiO_2$ film serving as a gate insulating film having a thickness of, e.g., 1 to 2 nm. An exemplary transistor as a semiconductor device of such a gate structure will be described with reference to FIG. 15. FIG. 15 is a schematic view of an exemplary transistor having a high-k dielectric thin film serving as a gate insulating film.

In FIG. 15, a source S and a drain D are formed at the surface of a semiconductor wafer W made of a silicon substrate; and a base film 2 made of a $SiO_2$ film, a high-k dielectric thin film 4, a nitride film 6 and a gate electrode 8 are formed on the surface of the semiconductor wafer W between the source S and the drain D in that order from the bottom side. The base film 2 is formed by oxidizing the silicon surface of the semiconductor wafer W. The high-k dielectric thin film 4 is formed by thermal CVD (Chemical Vapor Deposition) by using metal organic compound materials including refractory metal such as Hf.

The nitride film 6 is formed by nitriding the surface of the high-k dielectric thin film 4 and it prevents metal in the gate electrode 8 from diffusing into the high-k dielectric thin film 4. A polysilicon film with implanted impurities, a metal film such as a tungsten film or a tantalum film or a nitride film thereof may be used for the gate electrode 8.

On the other hand, since metal organic compound materials are used in forming the high-k dielectric thin film 4 as described above, the high-k dielectric film 4 inevitably includes some carbon (C) components. Therefore, the included carbon components reduce a dielectric constant to cause a leakage current and further make a critical value of the transistor unstable. For this, the high-k dielectric thin film 4 after formed is heated to 800 to 1000° C. to perform annealing thereon so that the included carbon components can be removed as much as possible.

However, since removal of the carbon components by high temperature annealing reduces the film density, the dielectric constant is reduced, which deteriorates film quality and cannot provide desired electrical characteristics.

As methods to compensate for the carbon deficiency of the high-k dielectric thin film, there have been suggested a method for exposing a high-k dielectric thin film to plasma-excited oxygen radicals and a method for applying ultraviolet rays to a high-k dielectric thin film in an ozone atmosphere, i.e. $UV-O_3$ processing (see, e.g., Japanese Patent Laid-open Publication No. H9-121035).

However, in the method for exposing a high-k dielectric thin film to plasma-excited oxygen radicals, uncontrolled excessive radicals are formed and they pass through the high-k dielectric thin film to increase the thickness of the $SiO_2$ film serving as a base film, resulting in an increase of the Equivalent Oxide Thickness (EOT) of the gate insulating film. The EOT refers to a value obtained by converting a thickness of a gate insulating film into a thickness of a SiO film, the gate insulating film being formed by laminating a high-k dielectric thin film on a $SiO_2$ film serving as a base film.

Further, since the $UV-O_3$ processing method described above uses ozone which is a strong oxidizing agent, the thickness of the $SiO_2$ film serving as a base film increases at the same time as the oxygen deficiency is compensated for, which results in an increase in the EOT of the gate insulating film.

SUMMARY OF THE INVENTION

In view of the above, the present invention provides a method for modifying a high-k dielectric thin film and a semiconductor device capable of increasing a dielectric constant and achieving better electrical characteristics by preventing deficiency and increasing the film density by removing carbon components in the high-k dielectric thin film and sintering the film by means of applying ultraviolet rays to the high-k dielectric thin film at a predetermined temperature in an inert gas atmosphere or in an oxygen atmosphere.

In accordance with one aspect of the present invention, there is provided a method for modifying a high-k dielectric thin film formed on a surface of a target object by using metal organic compound materials.

The method includes a preparation process for preparing the target object where the high-k dielectric thin film is formed on the surface and a modification process for modifying the high-k dielectric thin film by applying UV rays to the high-k dielectric thin film in an inert gas atmosphere while the target object is maintained at a predetermined temperature.

Since the film density is increased by removing the carbon components from the high-k dielectric thin film and sintering the entire target object in the modification process in which ultraviolet rays are applied to the high-k dielectric thin film at a low temperature in an inert gas atmosphere, deficiency occurrence is prevented and the film density is increased. Therefore, the dielectric constant is increased and better electrical characteristics are obtained.

The method may further includes, before the modification process, a reoxidation process for compensating for oxygen deficiency of the high-k dielectric thin film by applying UV rays to the high-k dielectric thin film in an oxygen atmosphere while the target object is maintained at a predetermined temperature.

In this case, oxygen deficiency of the high-k dielectric thin film is compensated for, which results in improving film quality.

Or, the method may further includes, after the modification process, a reoxidation process for compensating for oxygen deficiency of the high-k dielectric thin film by applying UV rays to the high-k dielectric thin film in an oxygen atmosphere while the target object is maintained at a predetermined temperature.

In this case also, oxygen deficiency of the high-k dielectric thin film is compensated for, which results in improved film quality.

In accordance with another aspect of the present invention, there is provided a method for modifying a high-k dielectric thin film formed on a surface of a target object by using metal organic compound materials.

The method includes a preparation process for preparing the target object where the high-k dielectric thin film is formed on the surface and a modification process for modifying the high-k dielectric thin film by applying UV rays to the high-k dielectric thin film in an oxygen atmosphere while the target object is maintained at a predetermined temperature.

Since the film density is increased by removing the carbon components from the high-k dielectric thin film and sintering the entire target object in the modification process in which ultraviolet rays are applied to the high-k dielectric thin film at a predetermined temperature in an oxygen atmosphere, deficiency occurrence is prevented and the film density is increased. Therefore, the dielectric constant is increased and better electrical characteristics are obtained.

Here, the processing pressure when the UV rays are applied to the high-k dielectric thin film in the oxygen atmosphere is preferably in a range from 2.6 to 65 Pa. The UV rays may have a wavelength of 172 nm.

Further, a base film made of a $SiO_2$ film formed in an oxidation process may be formed under the high-k dielectric thin film.

Here, the base film is preferably formed in a base film forming process performed before a high-k dielectric thin film forming process for forming the high-k dielectric thin film on the surface of the target object.

Further, the base film may be formed at the same time when the modification process is performed.

Further, the predetermined temperature in the modification process may be in a temperature range for maintaining oxygen bonds in the high-k dielectric thin film. Specifically, the predetermined temperature in the modification process is preferably 500° C. or below.

Further, the high-k dielectric thin film may be formed of a refractory metal oxide or its silicate Further, the refractory metal may be one of Hf, Ta, Ti, W and Zr.

Further, the modification method further includes, after the modification process, a nitridation process for nitriding the surface of the high-k dielectric thin film.

Or, the modification method further includes before the modification process, a nitridation process for nitriding the surface of the high-k dielectric thin film.

Further, the high-k dielectric thin film may serve as a gate insulating film of a transistor.

Further, the inert gas may include at least one of $N_2$, He, Ar, Ne, Kr and Xe.

In accordance with still another aspect of the present invention, there is provided a semiconductor device including the high-k dielectric thin film modified by the above method, which serves as a gate insulating film.

In accordance with the method for modifying a high-k dielectric thin film and semiconductor device of the present invention, the following effects can be obtained.

Since the film density is increased by removing the carbon components from the high-k dielectric thin film and sintering the entire target object in the modification process in which ultraviolet rays are applied to the high-k dielectric thin film at a predetermined temperature in an inert gas or oxygen atmosphere, deficiency occurrence is prevented the film density is increased. Therefore, the dielectric constant is increased and better electrical characteristics are obtained.

BRIEF DESCRIPTION OF THE DRAWINGS

FIG. 3 is a flow chart illustrating a process of a method in accordance with the first embodiment.

DETAILED DESCRIPTION OF THE EMBODIMENTS

Hereinafter, embodiments of a method for modifying a high-k dielectric thin film and a semiconductor device of the present invention will be described in detail with reference to accompanying drawings.

Figure 1:
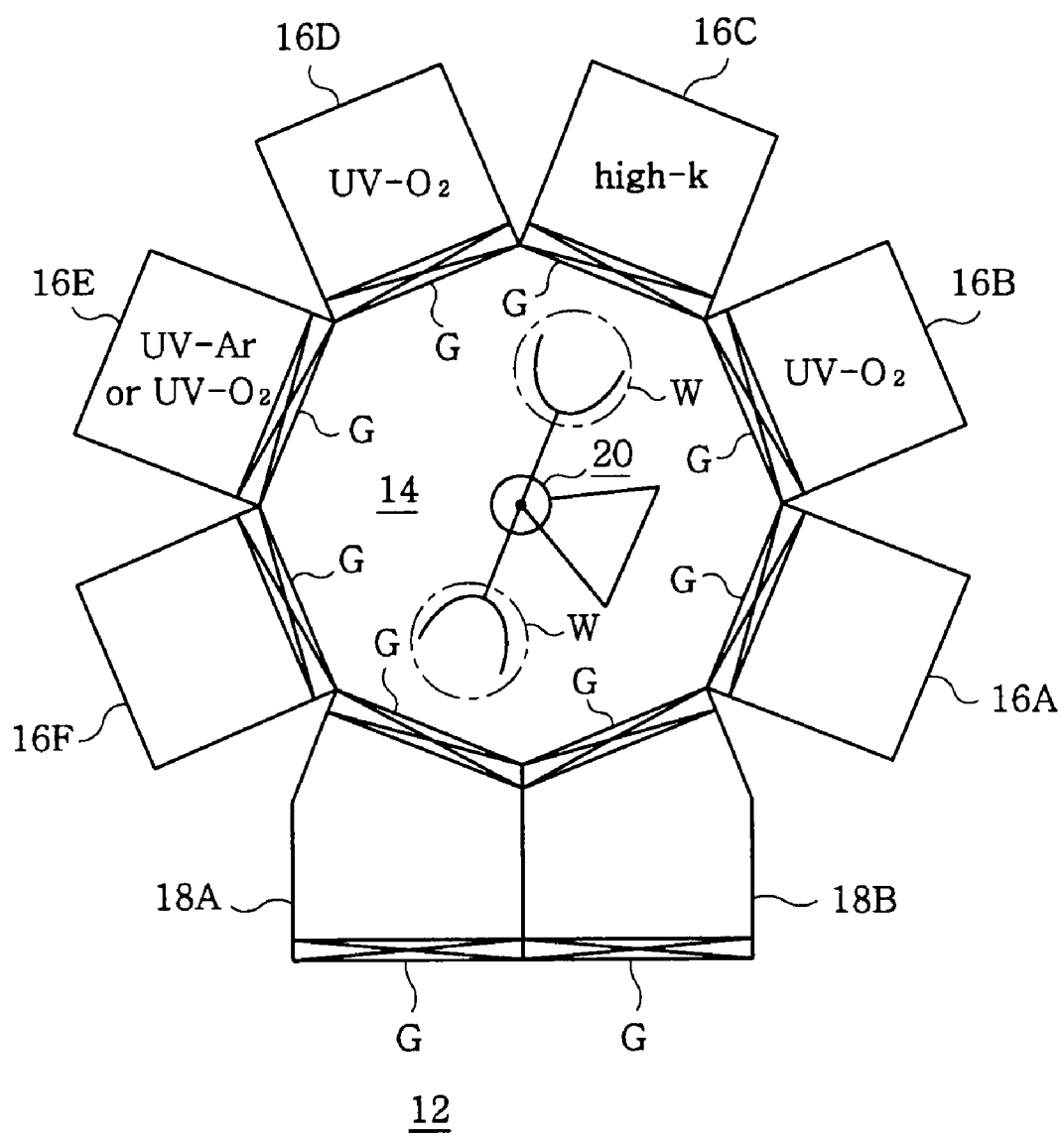
FIG. 1 is a schematic configuration view illustrating an exemplary processing system for implementing the method of the present invention.
Figure 2:
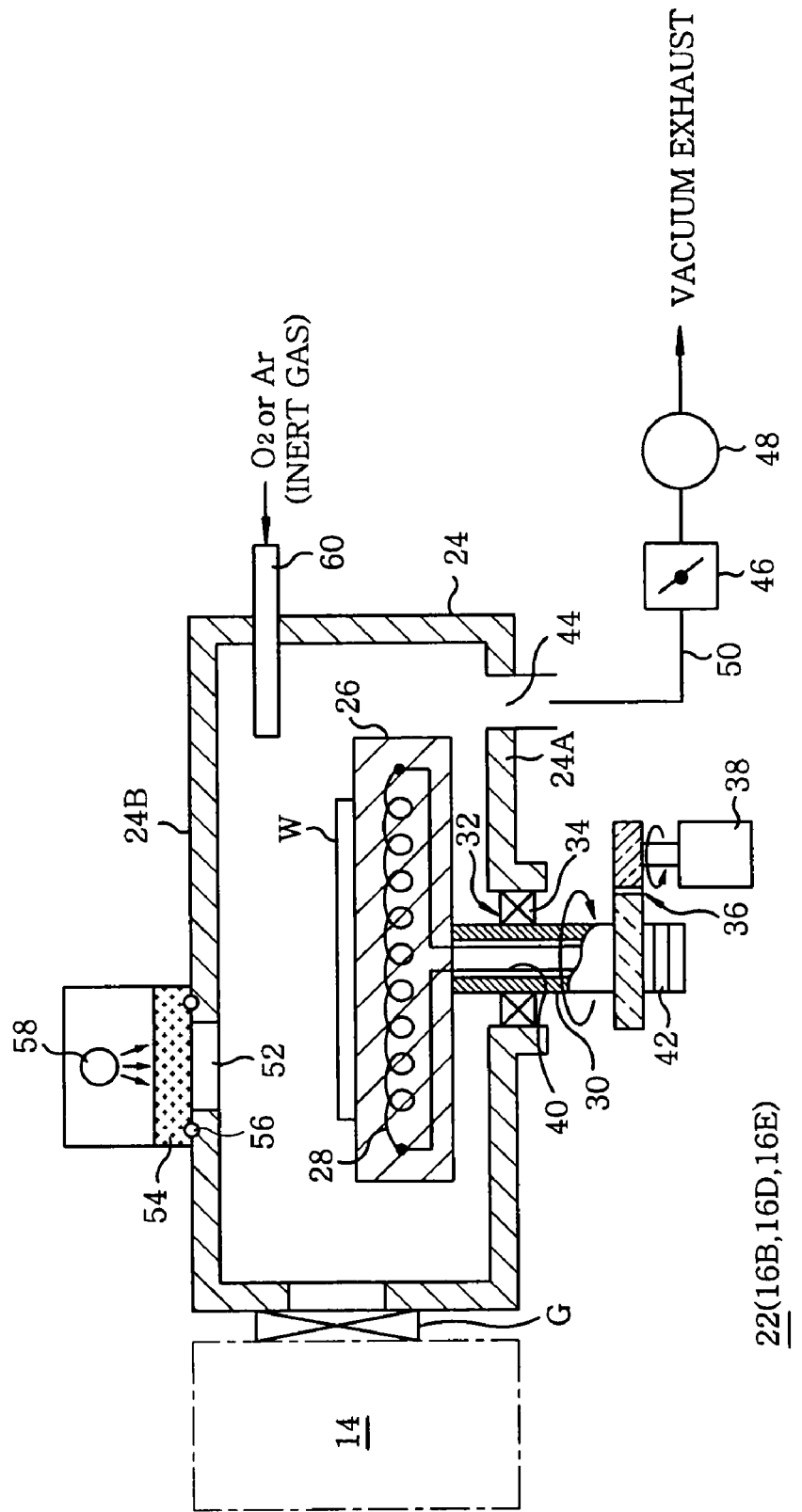
FIG. 2 is a configuration view of an ultraviolet processing apparatus for use in the processing system.

FIG. 1 is a schematic configuration view illustrating an exemplary processing system for implementing the method in accordance with the present invention and FIG. 2 is a configuration view of an ultraviolet processing apparatus for use in the processing system.

First, the processing system including an ultraviolet processing apparatus (modification apparatus) for implementing the method in accordance with the present invention will be described with reference to FIG. 1.

As shown in FIG. 1, a clustered processing system 12 for processing a target object, e.g., a semiconductor wafer formed of a silicon substrate, includes an octagonal common transfer chamber 14 to which six processing apparatuses 16A to 16F and two load-lock chambers 18A and 18B are attached. The processing apparatuses 16A to 16F and the load-lock chambers 18A and 18B are connected to the common transfer chamber 14 via respective opening/closing gate valves G. Gate valves G are also installed at the loading/unloading ports of the load-lock chambers 18A and 18B.

The two load-lock chambers 18A and 18B can be vacuum exhausted and be brought back to the atmospheric pressure. The load-lock chambers 18A and 18B are filled with an inert gas, e.g., an $N_2$ gas, to be back to the atmospheric pressure.

A wafer W is transferred between the outside kept at the atmospheric pressure and the common transfer chamber 14 maintained at a vacuum pressure via the load-lock chambers 18A and 18B.

The common transfer chamber 14 is always kept under a vacuum pressure when it is in operation. Installed in the common transfer chamber 14 is a transfer mechanism 20 with two picks which is revolvable, contractible and extensible and the wafer W can be freely transferred among the processing apparatuses 16A to 16F and load-lock chambers 18A and 18B by the transfer mechanism 20.

Each processing apparatus will be described hereinafter.

The first processing apparatus 16A is a pretreatment apparatus for performing pretreatment. The pretreatment apparatus 16A removes a native oxide film ($SiO_2$) on the surface of the wafer W by converting it into an N—O—Si—H based volatile film with using nitrogen radicals, oxygen radicals and NF gases.

Figure 15:
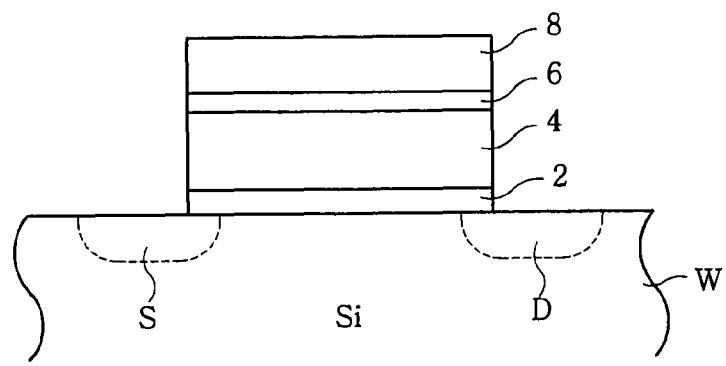
FIG. 15 shows a schematic view of an exemplary transistor having a high-k dielectric thin film serving as a gate insulating film.

The second processing apparatus 16B is a base film forming apparatus for forming a very thin base film 2 (see FIG. 15). The base film forming apparatus 16B forms the base film 2 made of a $SiO_2$ film by oxidizing the surface of the wafer W with oxygen radicals generated by ultraviolet (hereinafter, referred to as "UV") rays and oxygen gases under low pressure. The base film forming apparatus 16B is an ultraviolet processing apparatus. As will be described later, the base film forming apparatus 16B may not be used in some embodiments.

The third processing apparatus 16C is a CVD processing apparatus for forming a high-k dielectric thin film 4 (see FIG. 15). The CVD processing apparatus 16C forms the high-k dielectric thin film 4, such as, $HfSiO_2$ or the like, by thermal CVD by using metal organic compound materials. As described above, due to the metal organic compound materials used in film forming, the high-k dielectric film 4 inevitably includes carbon.

The fourth processing apparatus 16D is a reoxidation apparatus for performing a reoxidation process. The reoxidation apparatus 16D compensates for oxygen deficiency of the film formed on the wafer surface by applying oxygen radicals generated by UV rays and oxygen gases to the wafer surface. The reoxidation apparatus 16D is an ultraviolet processing apparatus. As will be described later, the reoxidation process may be omitted and its order may be changed in some embodiments.

The fifth processing apparatus 16E is a modification apparatus for performing a modification process on the high-k dielectric thin film. In the modification apparatus 16E, carbon components are extracted from the film and the high-k dielectric thin film 4 is modified by providing UV rays and inert gases or UV rays and $O_2$ gases thereto at a low temperature, e.g., 500° C. or below, and the film density is increased by sintering the film.

A series of modification operations on the high-k dielectric thin film 4 refers to the modification process performed by the modification apparatus 16E by itself. Further, it also refers to a combination process of the modification process by the modification apparatus 16E and the reoxidation process performed by the reoxidation apparatus 16D. The modification apparatus 16E is an ultraviolet processing apparatus.

As will be described later, such a modification process may use UV rays and inert gases or UV rays and $O_2$ gases depending on the embodiment.

The sixth processing apparatus 16F is a nitridation processing apparatus for performing a nitridation process to form a nitride film 6 (see FIG. 15). The nitridation processing apparatus 16F forms the nitride film 6 such as SiN or the like by nitriding the surface of the high-k dielectric thin film 4 by using a plasma under an $N_2$ or $NH_3$ atmosphere. As will be described later, the nitridation process may not be performed and its order may be changed in some embodiments.

It is noted that each of the processing apparatuses 16A to 16F, if unused, may not be provided in the embodiments to be described later.

A structure of the ultraviolet processing apparatus commonly used in the base film forming apparatus 16B, the reoxidation apparatus 16D and the modification apparatus 16E will be described hereinafter.

An ultraviolet processing apparatus 22, which is used in common in the apparatuses 16B, 16D and 16E, includes an evacuable cylindrical processing chamber 24 made of aluminum. The processing chamber 24 has a mounting table 26 mounting thereon a semiconductor wafer W, in which a resistance heater 28 for heating the wafer W is embedded. Installed at a central bottom portion of the mounting table 26 is a downwardly extended rotation support 30 which is hollow and airtightly sealed. The rotation support 30 is inserted into a through hole 32 at a bottom portion 24A of the chamber 24. Disposed between the through hole 32 and the rotation support 30 is a magnetic fluid seal 34 which supports the rotation support 30 while allowing rotation of the rotation support 30 and airtightly sealing the processing chamber 24.

Installed at a bottom portion of the rotation support 30 is a gear mechanism 36, which is driven by a motor 38 so that the rotation support 30 and the mounting table 26 can be rotated as a unit. A feeder line 40 connected to the resistance heater 28 is installed in the hollow rotation support 30. The lower portion of the feeder line 40 is connected to a slip ring 42 located at the lower portion of the rotation supporting 30 to receive power from an external power supply.

Formed at the bottom portion 24A of the processing chamber 24 is a gas exhaust port 44. A gas exhaust line 50 with a pressure control valve 46 and a vacuum pump 48 is connected to the gas exhaust port 44 such that the processing chamber 24 can be evacuated to a predetermined pressure if necessary.

Provided at a ceiling portion 24B of the processing chamber 24 is a long thin irradiation hole 52 to which a transparent window 54 for transmitting UV rays is attached airtightly through a seal member 56 such as an O ring. A UV lamp 58 is disposed outside of the transparent window 54 so that UV rays can be applied to the surface of the rotating wafer W through the transparent window 54.

An opening/closing gate valve G is installed at a sidewall of the processing chamber 24 so that the wafer W can be transferred between the processing chamber 24 and the common transfer chamber 14 through the open gate valve G.

Provided on the other sidewall of the processing chamber 24, which is opposite to the gate valve G, is a gas nozzle 60 serving as a gas introduction unit for introducing a required gas therein at a controlled flow rate. The gas supplied here is an oxygen gas to be used in the base film forming apparatus 16B and reoxidation apparatus 16D. In the modification apparatus 16E, an oxygen gas is supplied in the UV-$O_2$ processing and an inert gas is supplied in the UV-inert gas processing. Although one of $N_2$, He, Ar, Ne, Ke and Xe, or a mixture thereof may be used as the inert gas, an Ar gas is employed as the inert gas in FIG. 2.

As for the process of the ultraviolet processing apparatus 22, the semiconductor wafer W is mounted on the mounting table 26 and the entire mounting table 26 is rotated while the wafer W is heated to a predetermined temperature by the resistance heater 28. Then, a processing gas such as an $O_2$ gas or Ar gas (inert gas) is supplied to the processing chamber 24 depending on the processing type and the processing chamber 24 is maintained at a predetermined pressure. At the same time, UV rays from the UV lamp 58 are applied to the surface of the rotating wafer W through the transparent window 54 to perform a predetermined process. While UV rays of different wavelengths may be used, UV lamps emitting UV rays with wavelengths of, e.g., 172 nm, 183 nm and 258 nm are typically used. Preferably, an excimer lamp emitting UV rays having a wavelength of 172 nm is used.

Since the base film forming apparatus 16B, the reoxidation apparatus 16D and the modification apparatus 16E share the same structure as described above, each process may be performed by installing one or two ultraviolet processing apparatuses 22 and using the same or different processing gases.

Next, the method of the present invention using the processing system 12 shown in FIG. 1 and the ultraviolet processing apparatus 22, e.g., 16B, 16D or 16E, shown in FIG. 2 will be described.

First Embodiment

The method in accordance with the first embodiment of the present invention will be described.

FIG. 3 is a flow chart illustrating the process of the method of the first embodiment. First, a semiconductor wafer W to be processed is loaded into the common transfer chamber 14 through the load-lock chamber 18A or 18B (see FIG. 1) and then transferred to the pretreatment apparatus 16A to be pretreated (step S1). In the pretreatment process, a native oxide film on the surface of the wafer W is removed by using nitrogen radicals, oxygen radicals and NF gases as described above.

When the pretreatment process is completed, the wafer W is transferred from the pretreatment apparatus 16A to the base film forming apparatus 16B and a base film forming process is conducted (step S2). The base film forming apparatus 16B has the structure shown in FIG. 2. A base film 2 (see FIG. 15) which is a very thin $SiO_2$ film of high surface uniformity is formed by oxidizing the surface of the wafer W by applying UV rays from the UV lamp 58 to the wafer surface in an $O_2$ atmosphere while the wafer W on the mounting table 26 is rotating. The processing pressure at this time is relatively low, for example, in a range from 2.6 to 133 Pa. The processing temperature ranges from, e.g., 450 to 700° C. A target thickness of the base film 2 is 4 Å and UV rays are applied for a very short time.

When the base film forming process is completed, the wafer W is transferred from the base film forming apparatus 16B to the CVD processing apparatus 16C and a process for forming a high-k dielectric thin film is carried out (step S3). In this process, a high-k dielectric thin film 4 (see FIG. 15) is formed on the wafer surface by thermal CVD by using metal organic compound materials.

The high-k dielectric thin film 4 may be formed of refractory metal such as hafnium oxide (HfO), hafnium silicate ($HfSiO_2$) or the like as described above. The high-k dielectric thin film 4 has a thickness in a range from 10 to 50 Å. At that time, the processing temperature ranges from, e.g., 350 to 600° C. and the processing pressure ranges from, e.g., 35 to 400 Pa.

Refractory metal including hafnium may be selected from tetrakis-dimethylamino-hafnium ($Hf[N(CH_3)_2]_4$) and dimethyl-bis(cyclopentadienyl)hafnium ($Hf(CH_3)_2(C_5H_5)_2$).

When the high-k dielectric thin film forming process is completed, the wafer W is transferred from the CVD processing apparatus 16C to the modification apparatus 16E and a modification process is then performed (step S4). Here, the reoxidation apparatus 16D is not used and is skipped.

The modification apparatus 16E, which has the structure shown in FIG. 2, performs a modification process on the high-k dielectric thin film 4 (see FIG. 15) formed on the wafer surface by applying UV rays from the UV lamp 58 to the wafer surface in an inert gas, e.g., Ar, atmosphere while the wafer W on the mounting table 26 is rotating.

The processing pressure in this modification process is in a range from 2.6 to 133 Pa. The process is performed at a temperature of, e.g., 500° C. or below, that is low enough not to cut oxygen bonds in the high-k dielectric thin film 4. For the effective modification, the temperature is preferably set to be about 450° C. The processing time depends on the thickness of the high-k dielectric thin film 4 and, for example, ranges from 300 to 1800 seconds.

Organic components, especially, carbon components, remaining in the high-k dielectric thin film 4 are removed in the modification process, and the film 4 is sintered and hardened. Therefore, the film density of the high-k dielectric thin film 4 is increased so that deficiency occurrence can be prevented and the film 4 can maintain a high-k dielectric constant.

Since the film quality of the high-k dielectric thin film 4 can be improved in this way, better electrical characteristics can also be obtained. In the first embodiment, modification operations are performed through only the modification process.

When the modification process is finished, the wafer is transferred from the modification apparatus 16E to the nitridation processing apparatus 16F and then a nitridation process is carried out (step S5).

In the nitridation process, radicals including nitrogen radicals are generated by a plasma formed in an $N_2$ or $NH_3$ atmosphere and they are applied to the surface of the high-k dielectric thin film 4 to thereby form a nitride film 6 (see FIG. 15).

When the nitridation process is completed, the wafer W is taken out from the nitridation processing apparatus 16F and then unloaded from the processing system 12 via the load-lock chamber 18A or 18B, whereby a series of the processes in the processing system 12 is completed.

After that, a gate electrode 8 as shown in FIG. 15 is formed on the wafer W and therefore a semiconductor device, e.g., a transistor, is fabricated.

Hereinafter, results of evaluating the effectiveness of UV irradiation in the modification process will be described.

Figure 4A:
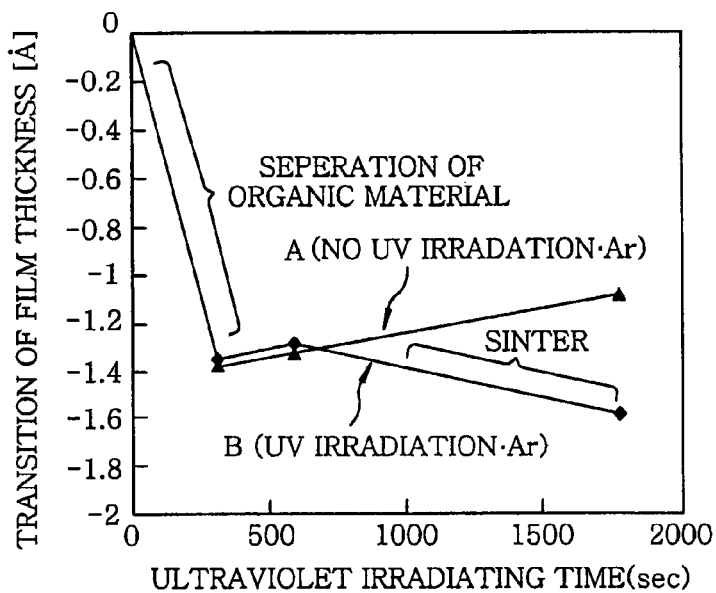
FIG. 4A presents a relationship between the UV irradiation time and the film thickness.
Figure 4B:
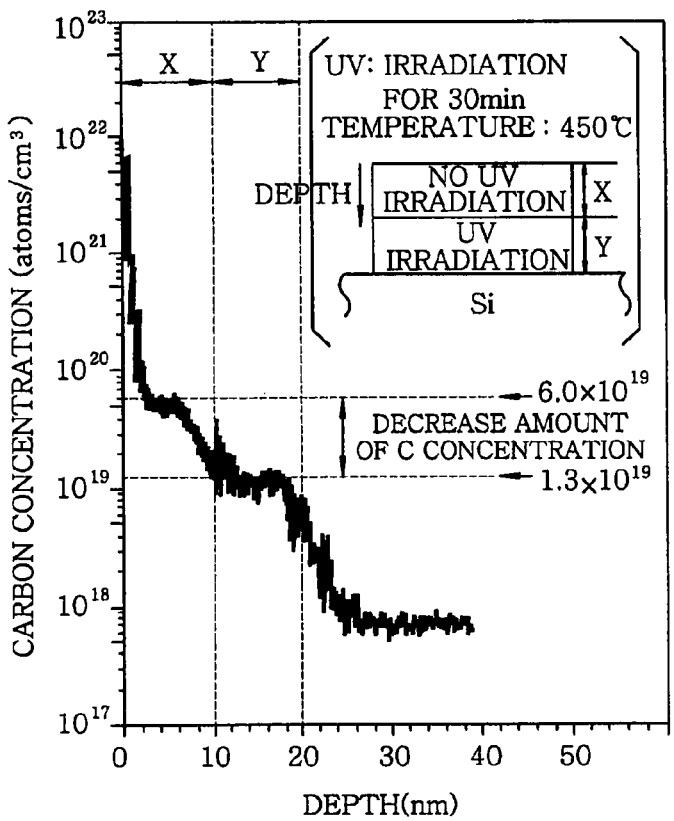
FIG. 4B presents carbon concentration distribution distributed in the film depth direction.

FIGS. 4A and 4B are graphs showing an effect of UV irradiation on the thickness and carbon concentration of the high-k dielectric thin film, respectively.

FIG. 4A shows a relationship between the UV irradiation time and the film thickness and FIG. 4B shows carbon concentration distribution in the film depth direction. In FIG. 4A, the horizontal axis indicates the UV irradiation time and the vertical axis indicates the film thickness variation. In FIG. 4A, the characteristic curve A indicates the case without UV irradiation in an Ar atmosphere and the characteristic curve B indicates the case with UV irradiation in an Ar atmosphere. Here, the high-k dielectric thin film had an initial thickness of 40 Å and it was heated to 450° C. and processed in an Ar atmosphere. The film thickness variation was measured by an optical film thickness measurement device (ellipsometer).

As apparent from the characteristic curves A and B shown in the graph, the film thickness rapidly decreases until 300 seconds elapsed after the experimental start. This is because organic components, i.e. mostly carbon components of the film surface get out of the surface. Then, the film thickness increases slowly and linearly in case of the characteristic curve A without UV irradiation. It is conjectured that the film surface is oxidized by $O_2$ or $H_2O$ components remaining at the film surface, which makes the film thicker.

On the other hand, in case of the characteristic curve B with UV irradiation at a wavelength of 172 nm, after 300 seconds, the film thickness first increases and then decreases slightly and linearly. This is because the high-k dielectric thin film is gradually sintered and shrunk by UV irradiation and therefore the film thickness decreases. It is confirmed that the film density can be increased by sintering the high-k dielectric thin film with UV irradiation. Further, measurement results of the density, film thickness and surface roughness of the high-k dielectric thin film are shown in Table 1. The X-ray reflectivity (XRR) method has been used for the measurement.

TABLE 1

| | DENSITY [g/cm³] | FILM THICKNESS [nm] | ROUGHNESS [nm] |
|---|---|---|---|
| INITIAL VALUE | 5.17 | 3.34 | 0.59 |
| NO UV IRRADIATION (A CHARACTERISTIC CURVE) | 5.16 | 3.31 | 0.59 |
| UV IRRADIATION (B CHARACTERISTIC CURVE) | 5.38 | 3.22 | 0.57 |

As apparent from Table 1, the initial density of 5.17 g/cm³ becomes 5.16 g/cm³ in case of no UV irradiation and it increases to 5.38 g/cm³ if there is UV irradiation. Therefore, it is confirmed that UV irradiation can increase the film density.

The initial film thickness of 3.34 nm slightly decreases to 3.31 nm in case of no UV irradiation and it significantly decreases to 3.22 nm if there is UV irradiation. That is, the film thickness can be significantly reduced by UV irradiation.

Regarding the roughness, the initial value is maintained and there is no problem.

FIG. 4B describes the result of the tested sample, where two layers of high-k dielectric thin films each of which includes $HfSiO_2$ and has a thickness of 10 nm were formed on a silicon substrate, UV rays were applied to the lower high-k dielectric thin film in an Ar atmosphere for 30 minutes and no UV rays were applied to the upper high-k dielectric thin film. The heating temperature was set to be 450° C. Then, the carbon concentration was measured along the depth (thickness) direction of the two high-k dielectric thin films by the secondary ion mass spectrometry (SIMS). The X and Y in the graph respectively correspond to the thickness of lower layer and upper layer.

As apparent from the graph of FIG. 4B, the carbon concentration in case of no UV irradiation is $6.0 \times 10^{19}$ atoms/cm³ and the carbon concentration in case of UV irradiation greatly decreases to $1.3 \times 10^{19}$ atoms/cm³, which confirms that the carbon concentration can be significantly decreased by UV irradiation.

Second Embodiment

Hereinafter, a method in accordance with the second embodiment of the present invention will be described.

Figure 5:
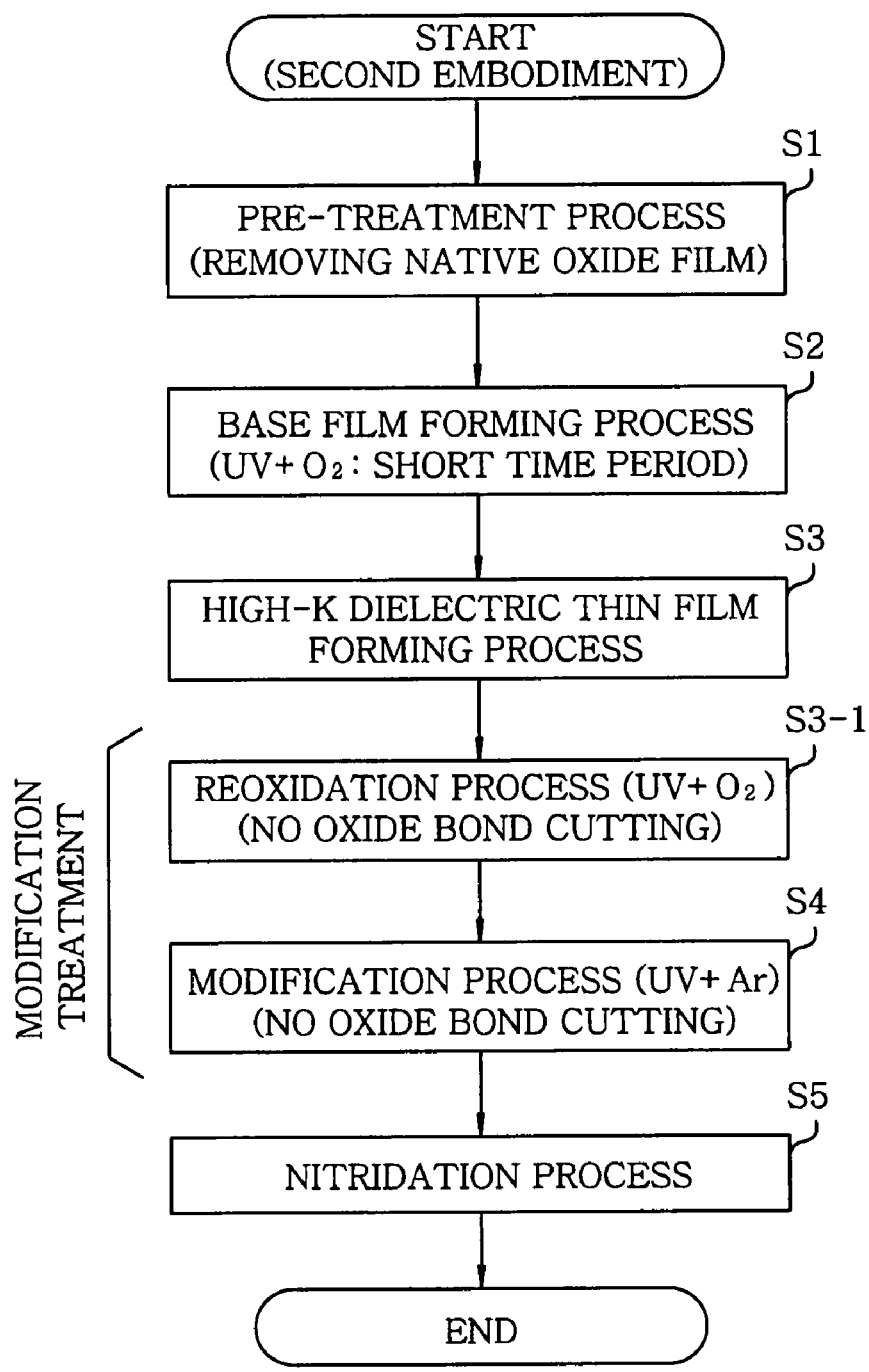
FIG. 5 is a flow chart illustrating a process of a method in accordance with the second embodiment.

FIG. 5 is a flow chart illustrating a process of the method of the second embodiment. The second embodiment is different from the first embodiment described in FIG. 3 in that a reoxidation process of the step S3-1 is provided between the steps S3 and S4 in FIG. 3. In this case, modification operations are performed in both the reoxidation process of the step S3-1 and the modification process of the step S4.

To be specific, when the high-k dielectric thin film forming process of the step S3 is completed, the wafer W is transferred from the CVD processing apparatus 16C to the reoxidation apparatus 16D (see FIG. 1) and the reoxidation process of the present invention is then performed (step S3-1).

The reoxidation apparatus 16D has the structure shown in FIG. 2. UV rays from the UV lamp 58 are applied to the surface of the rotating wafer W mounted on the mounting table 26 in an $O_2$ atmosphere of the processing chamber 24. It is preferable to use UV rays with a wavelength of 172 nm. This is applied to third to seventh embodiments which will be described later.

In this case, the processing temperature, i.e. the temperature of the wafer W is kept at 500° C. or below and is preferably kept at 450° C. so that oxygen bonds in the high-k dielectric thin film 4 are not cut.

Further, the processing pressure at this time is in a range from 2.6 to 133 Pa and it is preferably in the range from 2.6 Pa to 65 Pa so that UV attenuation caused by oxygen can be properly adjusted. This is also applied to the third to seventh embodiments which will be described later. The processing time depends on the thickness of the high-k dielectric thin film 4 and it is in a range from, e.g., 15 to 180 seconds.

Oxygen radicals are generated from $O_2$ gases by UV rays. The generated oxygen radicals intrude into the high-k dielectric thin film 4 and they are reoxidized to compensate for oxygen deficiency of the film. That is, the high-k dielectric thin film 4 with oxygen deficiency is not preferable. However, the oxygen deficiency can be compensated for by oxygen radicals generated by the reoxidation process and therefore the film quality can be improved as much.

Further, organic components, especially, carbon components, remaining in the high-k dielectric thin film 4 are removed by applying UV rays in the $O_2$ atmosphere, and the high-k dielectric thin film 4 is sintered and hardened. Accordingly, the film density of the high-k dielectric thin film 4 is increased so that deficiency occurrence can be prevented and the film 4 can maintain a high-k dielectric constant. Further, the thickness of the $SiO_2$ film is prevented from being thicker. The effect of the UV irradiation in the $O_2$ atmosphere is applied to the third to seventh embodiments which will be described later.

In this reoxidation process, if oxygen radicals pass through the high-k dielectric thin film 4 and reach an interface with the silicon substrate, a $SiO_2$ film is formed at the interface, which can make the base film 2 thicker. In order to prevent this, reoxidation conditions are chosen such that oxygen radicals do not pass through the high-k dielectric thin film 4. The processing conditions are: the pressure is about 2.67 Pa and the processing time is about 15 seconds.

When the reoxidation process is completed, the procedure proceeds to the step S4 and the above-described modification process and the remaining process are performed.

The second embodiment can provide the same effects as those in the first embodiment. In addition, the film quality is improved by compensating for the oxygen deficiency of the high-k dielectric thin film 4 and the film density is increased by reducing the carbon concentration and by sintering.

Third Embodiment

Hereinafter, a method in accordance with the third embodiment of the present invention will be described.

Figure 6:
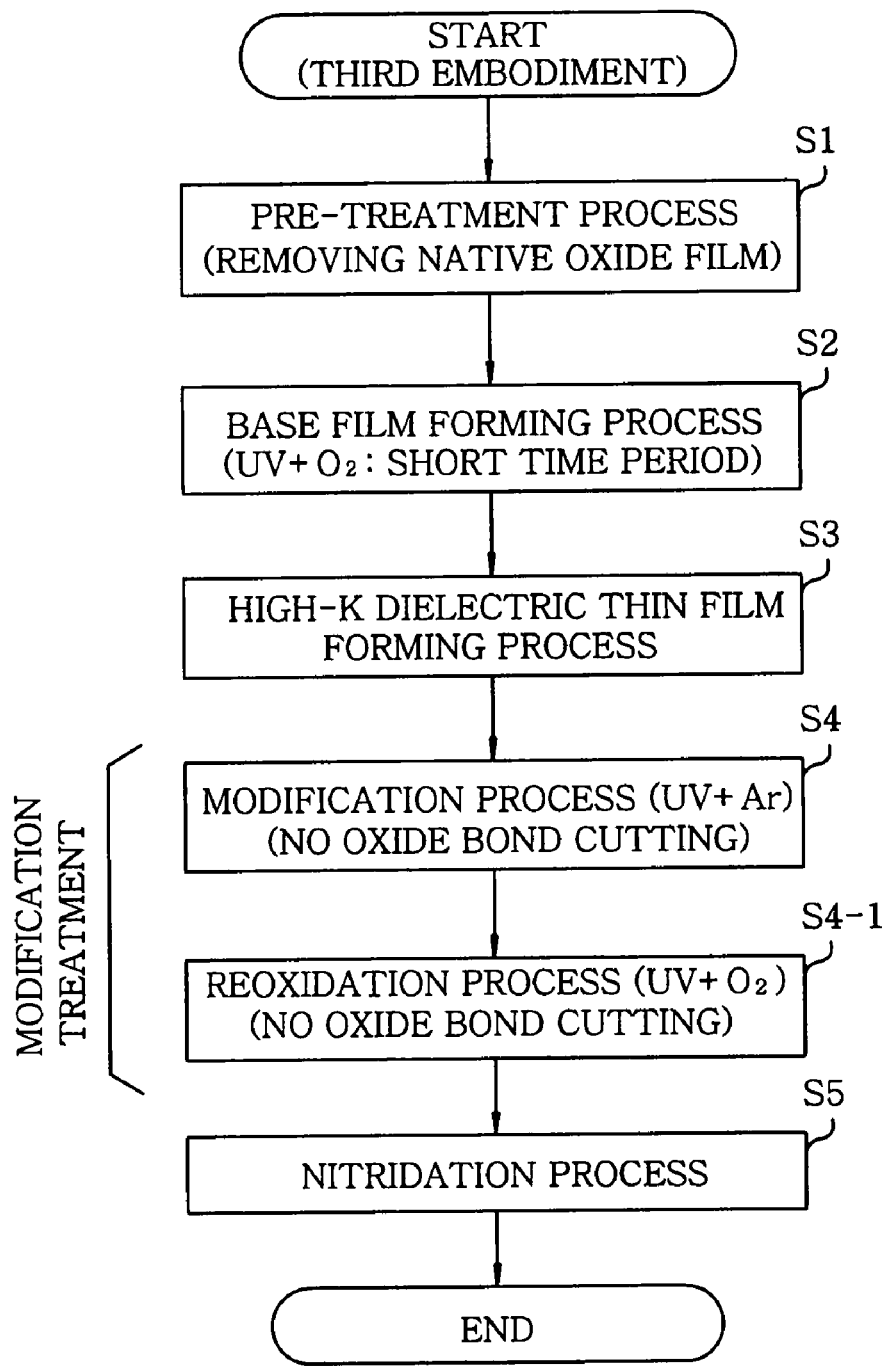
FIG. 6 is a flow chart illustrating a process of a method in accordance with the third embodiment.

FIG. 6 is a flow chart illustrating a process of the method of the third embodiment.

In the third embodiment, the order of the reoxidation process of the step S3-1 and modification process of the step S4 of the second embodiment shown in FIG. 5 are reversed and the reoxidation process is indicated here as the step S4-1.

The third embodiment can provide the same effects as those in the first embodiment as described above. Further, in the third embodiment, the film quality is improved by compensating for the oxygen deficiency of the high-k dielectric thin film 4 and the film density is increased by reducing the carbon concentration and sintering, as described in the second embodiment.

If UV rays are applied to the high-k dielectric thin film 4 in an Ar atmosphere in the modification process of the step S4, the film surface may be damaged by UV rays with high energy, whereby oxygen deficiency may occur. However, in the third embodiment, by performing the reoxidation process after the modification process, the oxygen deficiency is compensated for in the reoxidation process and therefore the film quality is improved as much.

Fourth Embodiment

Hereinafter, a method in accordance with the fourth embodiment of the present invention will be described.

Figure 7:
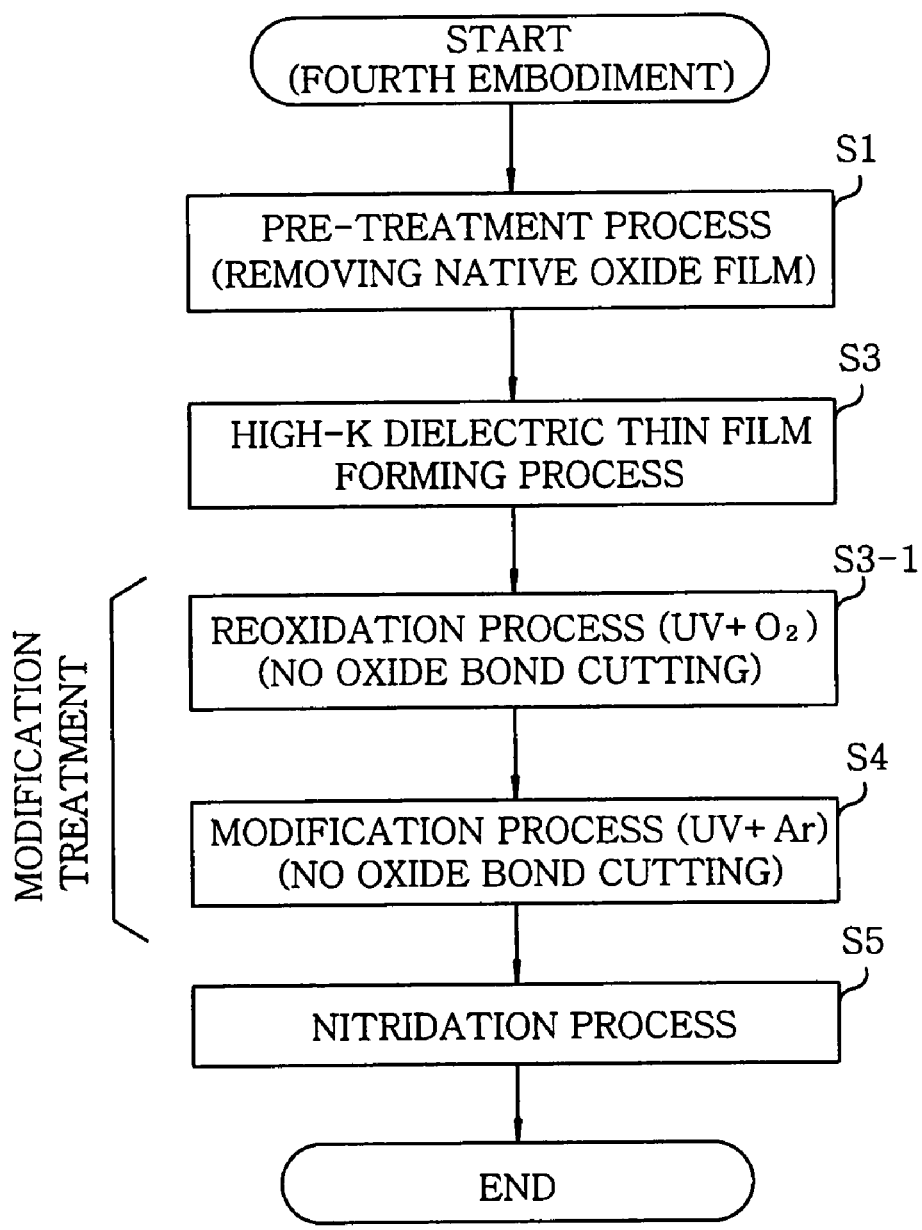
FIG. 7 is a flow chart illustrating a process of a method in accordance with the fourth embodiment.

FIG. 7 is a flow chart illustrating a process of the method of the fourth embodiment.

In the fourth embodiment as shown in FIG. 7, the base film forming process of the step S2 in the second embodiment as shown in FIG. 5 is omitted and the pretreatment process of the step S1 directly proceeds to the high-k dielectric thin film forming process of the step S3. The remaining processes are the same as those in the second embodiment except that reoxidation conditions are chosen such that the generated oxygen radicals pass through the high-k dielectric thin film 4 to form a base film. The processing conditions are: the pressure is about 2.67 Pa and the processing time is about 60 seconds.

Since the base film forming process is omitted in the fourth embodiment as described above, the base film 2 (see FIG. 15) does not seem to be formed at first look. However, during the reoxidation process of the step S3-1, the oxygen radicals generated from $O_2$ gases by UV rays intrude into the high-k dielectric thin film 4 and are reoxidized to compensate for oxygen deficiency of the film and, at the same time, some of the oxygen radicals pass through the high-k dielectric thin film 4 and reach an interface with the silicon substrate, whereby silicon is oxidized to form the base film 2 made of $SiO_2$. That is, in the fourth embodiment, the high-k dielectric thin film 4 is formed and then the base film 2 is formed at the interface between the high-k dielectric thin film 4 and the silicon substrate. Therefore, in the reoxidation process of the fourth embodiment, the oxygen deficiency is compensated for and the base film 2 is further formed.

The fourth embodiment can provide the same effects as those in the second embodiment as described above and further the film density is increased by reducing the carbon concentration and sintering. Furthermore, the throughput is improved by omitting the base film forming process of the step S2.

Fifth Embodiment

Hereinafter, a method in accordance with the fifth embodiment of the present invention will be described.

Figure 8:
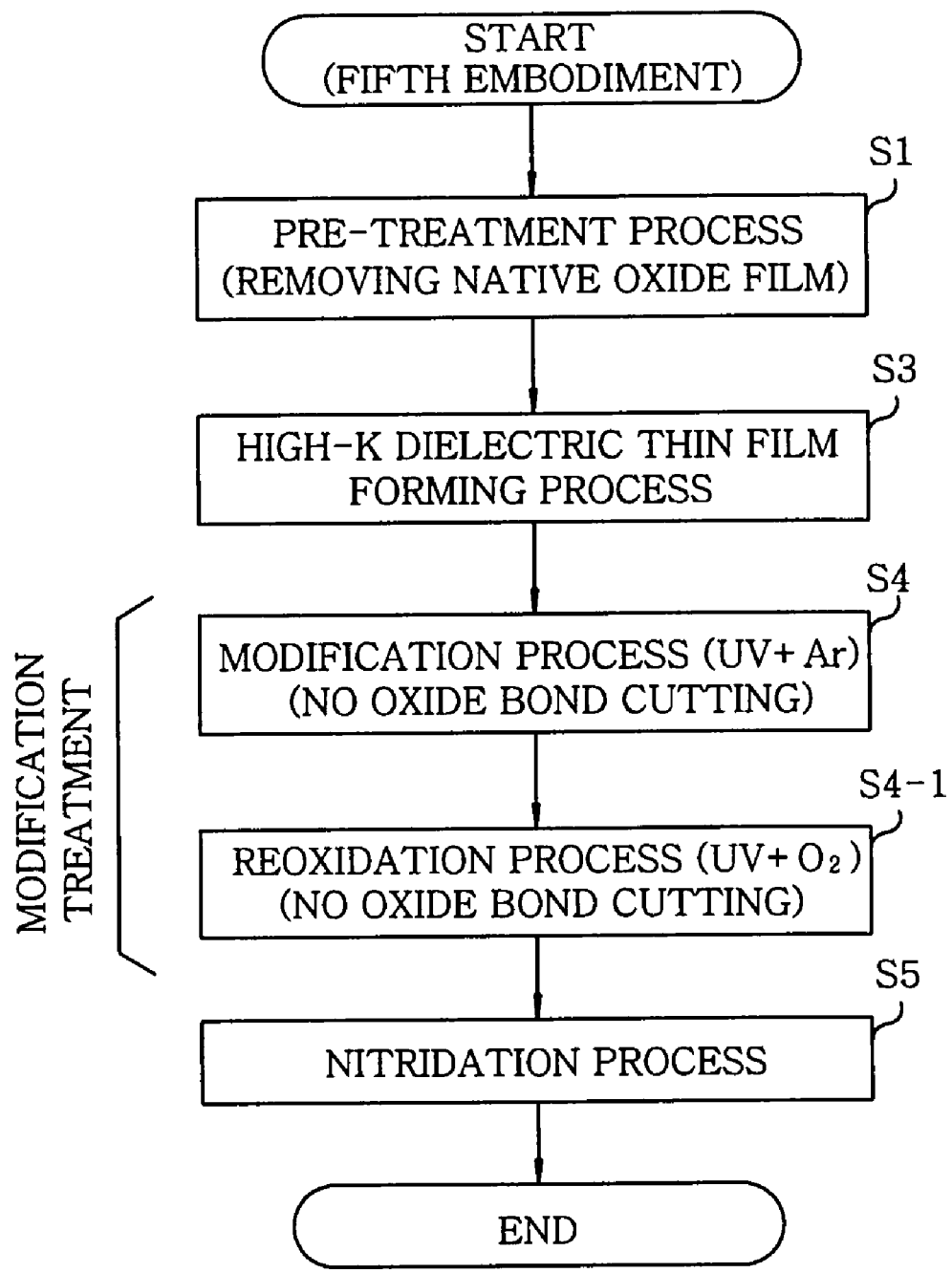
FIG. 8 is a flow chart illustrating a process of a method in accordance with the fifth embodiment.

FIG. 8 is a flow chart illustrating a process of the method of the fifth embodiment.

In the fifth embodiment as shown in FIG. 8, the base film forming process of the step S2 in the third embodiment as shown in FIG. 6 is omitted and the pretreatment process of the step S1 directly proceeds to the high-k dielectric thin film forming process of the step S3, which is the same as that in the fourth embodiment. The remaining processes are the same as those in the third embodiment except that reoxidation conditions are chosen such that the generated oxygen radicals pass through the high-k dielectric thin film 4 to form the base film. The processing conditions are: the pressure is 2.67 Pa and the processing time is 60 seconds.

Since the base film forming process is omitted in the fifth embodiment as described above, the base film 2 (see FIG. 15) does not seem to be formed at first look. However, during the reoxidation process of the step S4-1, the oxygen radicals generated from $O_2$ gases by UV rays intrude into the high-k dielectric thin film 4 and they are reoxidized to compensate for oxygen deficiency of the film. Further, some of the oxygen radicals penetrate through the high-k dielectric thin film 4 and reach an interface with the silicon substrate, whereby silicon is oxidized to form the base film 2 made of $SiO_2$. That is, the high-k dielectric thin film 4 is formed and then the base film 2 is formed at the interface between the high-k dielectric thin film 4 and the silicon substrate. Therefore, in the reoxidation process of the fifth embodiment, the oxygen deficiency is compensated for and the base film 2 is further formed.

The fifth embodiment can provide the same effects as those in the third embodiment as described above and further the film density is increased by reducing the carbon concentration and by sintering. Furthermore, the throughput is improved by omitting the base film forming process of the step S2.

Sixth Embodiment

Hereinafter, the method in accordance with the sixth embodiment of the present invention will be described.

Figure 9:
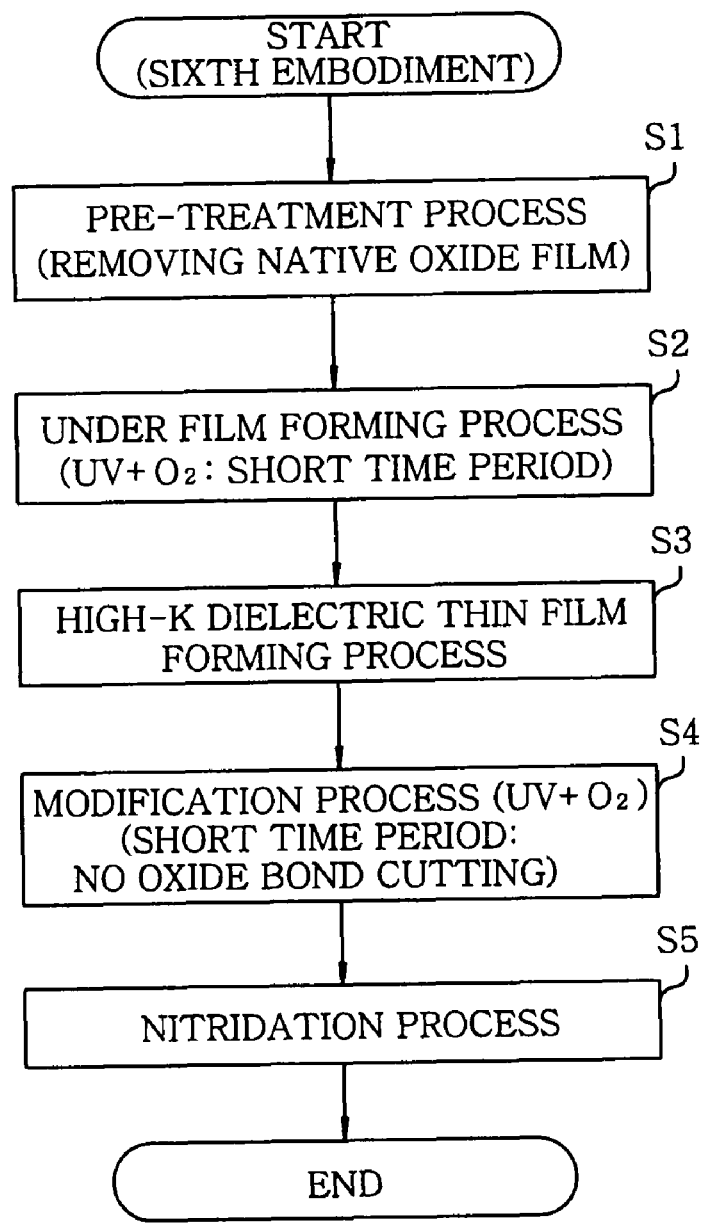
FIG. 9 is a flow chart illustrating a process of a method in accordance with the sixth embodiment.

FIG. 9 is a flow chart illustrating the process of the method of the sixth embodiment.

The sixth embodiment, as shown in FIG. 9, is the same as the first embodiment except that an Ar gas (inert gas) provided with UV irradiation in the modification process of the step S4 in the first embodiment shown in FIG. 3 is replaced by an oxygen ($O_2$) gas.

The modification process of the sixth embodiment modifies the high-k dielectric thin film 4 (see FIG. 15) formed on the wafer surface by applying UV rays from the UV lamp 58 to the wafer surface in an oxygen atmosphere, not in an inert gas atmosphere, of the processing chamber 24 while the wafer W on the mounting table 26 rotates.

The processing pressure is in a range from 2.6 to 133 Pa and preferably in a range from 2.6 to 65 Pa. The process is performed at a temperature of, e.g., 500° C., which is low enough not to cut oxygen bonds in the high-k dielectric thin film 4. The process temperature is preferably set at 450° C. for film modification efficiency. The processing time depends on the thickness of the high-k dielectric thin film 4 and is in a range from 15 to 180 seconds. The processing time is much shorter than that in the first embodiment.

Like the first embodiment, organic components, especially, carbon components, remaining in the high-k dielectric thin film 4 get out of the film during the modification process, and the film is sintered and hardened. Therefore, the film density of the high-k dielectric thin film 4 is increased so that deficiency occurrence can be prevented and the film 4 can maintain a high-k dielectric constant. Since the film quality of the high-k dielectric thin film 4 is improved, better electrical characteristics can also be obtained.

Since the oxygen radicals generated by UV irradiation intrude into the high-k dielectric thin film 4 and are reoxidized to compensate for oxygen deficiency of the film in the sixth embodiment, the sixth embodiment is also provided with the reoxidation process as described in the second embodiment.

Hereinafter, results of evaluating the effectiveness of UV irradiation (UV-$O_2$) in an $O_2$ atmosphere in the modification process will be described.

Figure 10:
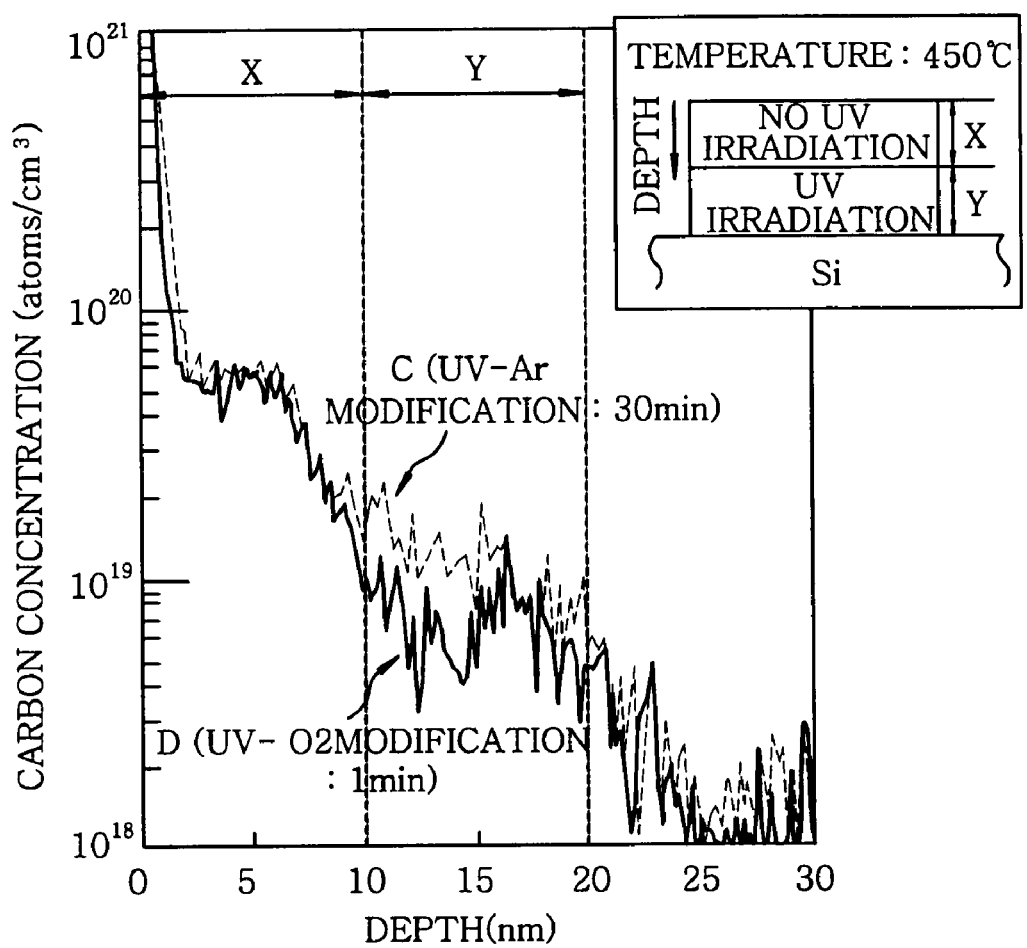
FIG. 10 is a graph showing an effect of UV irradiation and an atmosphere gas on the carbon concentration of the high-k dielectric thin film.

FIG. 10 is a graph showing an effect of the UV irradiation and atmosphere gas on the carbon concentration of the high-k dielectric thin film. Further, measurement results of the density, film thickness and surface roughness of the high-k dielectric thin film are shown in Table 2. The X-ray reflectivity (XRR) method has been used for the measurement.

TABLE 2

| | DENSITY [g/cm$^3$] | FILM THICKNESS [nm] | ROUGHNESS [nm] |
|---|---|---|---|
| INITIAL VALUE | 4.48 | 3.32 | 0.64 |
| UV-$O_2$ IRRADIATION | 4.71 | 3.24 | 0.60 |

As apparent from Table 2, the initial density of 4.48 g/cm$^3$ increased to 4.71 g/cm$^3$ if there was UV-$O_2$ irradiation, whereby it was confirmed that UV-$O_2$ irradiation can significantly increase the film density.

The initial film thickness of 3.32 nm significantly decreased to 3.24 nm in case of UV-$O_2$ irradiation. That is, it was confirmed that the film thickness can be significantly reduced by UV-$O_2$ irradiation.

Regarding the roughness, the initial value is maintained and there is no problem at all.

FIG. 10 describes the result of the tested sample, where two layers of high-k dielectric thin films each of which was made of HfSiO$_2$ and had a thickness of 10 nm were formed on a silicon substrate, UV rays were applied to the lower high-k dielectric thin film in an Ar or $O_2$ atmosphere for 30 minutes and no UV rays were applied to the upper high-k dielectric thin film, which was similar to that shown in FIG. 4B. The heating temperature was set at 450° C. Then, the carbon concentration was measured along the depth (thickness) direction of the two laminated high-k dielectric thin films by the SIMS. The X and Y in the graph correspond to the thickness of each layer.

The characteristic curve C indicates the case of UV irradiation in an Ar atmosphere and the characteristic curve D indicates the case of UV irradiation in an $O_2$ atmosphere. UV rays were applied in an Ar atmosphere for 30 minutes and applied in an $O_2$ atmosphere for one minute. As apparent from the graph, although UV rays were applied in an $O_2$ atmosphere for only one minute in the characteristic curve D, the carbon concentration is equal to or less than that of UV irradiation in an Ar atmosphere indicated by the characteristic curve C, especially in the Y region. That is, desired effects can be obtained in a short time by the modification process with UV irradiation in an $O_2$ atmosphere, which contributes to the throughput improvement.

Seventh Embodiment

Hereinafter, a method in accordance with the seventh embodiment of the present invention will be described.

Figure 11:
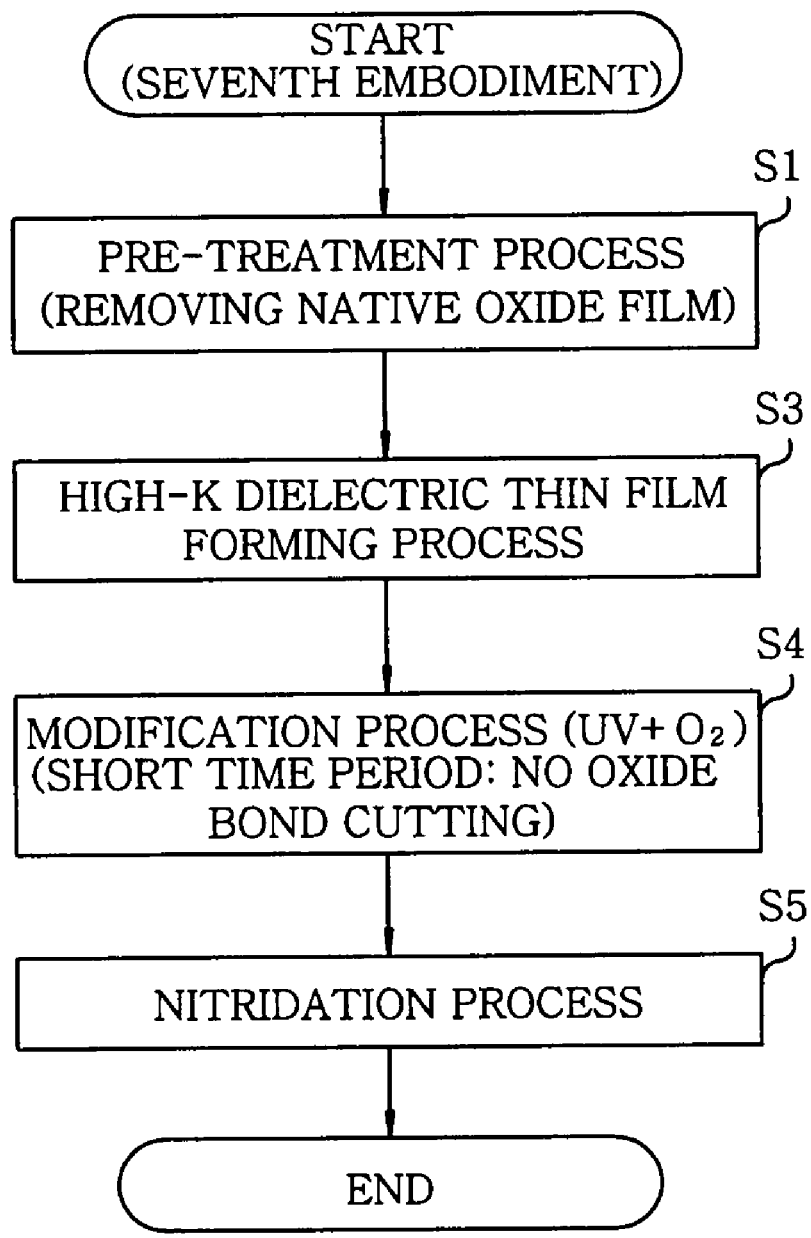
FIG. 11 is a flow chart illustrating a process of a method in accordance with the seventh embodiment.

FIG. 11 is a flow chart illustrating a process of the method of the seventh embodiment.

As shown in FIG. 11, the base film forming process of the step S2 in the sixth embodiment as shown in FIG. 9 is omitted and the pretreatment process of the step S1 directly proceeds to the high-k dielectric thin film forming process of the step S3 like the fourth embodiment shown in FIG. 4. The remaining processes are the same as those in the sixth embodiment.

Since the base film forming process is omitted in the seventh embodiment as described above, the base film 2 (see FIG. 15) does not seem to be formed at first look like the fourth embodiment. However, during the modification process of the step S4, the oxygen radicals generated from $O_2$ gases by UV rays intrude into the high-k dielectric thin film 4 and they are reoxidized to compensate for oxygen deficiency of the film. Further, some of the oxygen radicals pass through the high-k dielectric thin film 4 and reach an interface with the silicon substrate, whereby silicon is oxidized to form the base film 2 made of SiO$_2$. That is, in the seventh embodiment, the high-k dielectric thin film 4 is first formed and the base film 2 is then formed at the interface between the high-k dielectric thin film 4 and the silicon substrate. In the modification process of the seventh embodiment, the carbon concentration is reduced and the film 4 is sintered. Further, the oxygen deficiency is compensated for and the base film 2 is formed as well.

The seventh embodiment can provide the same effects as those in the sixth embodiment as described above and further the throughput is increased by omitting the base film forming process of the step S2.

Although the nitridation process has been performed after the modification process of the high-k dielectric thin film 4 in the above-described embodiments, it may be performed just before the modification process or it may be omitted.

(Evaluations of UV-$O_2$ and UV-Ar Processing)

Effects of UV irradiation in an $O_2$ atmosphere (hereinafter, referred to as "UV-$O_2$ processing") and of UV irradiation in an inert gas (Ar) atmosphere (hereinafter, referred to as "UV-Ar processing") will be described in detail.

Figure 12:
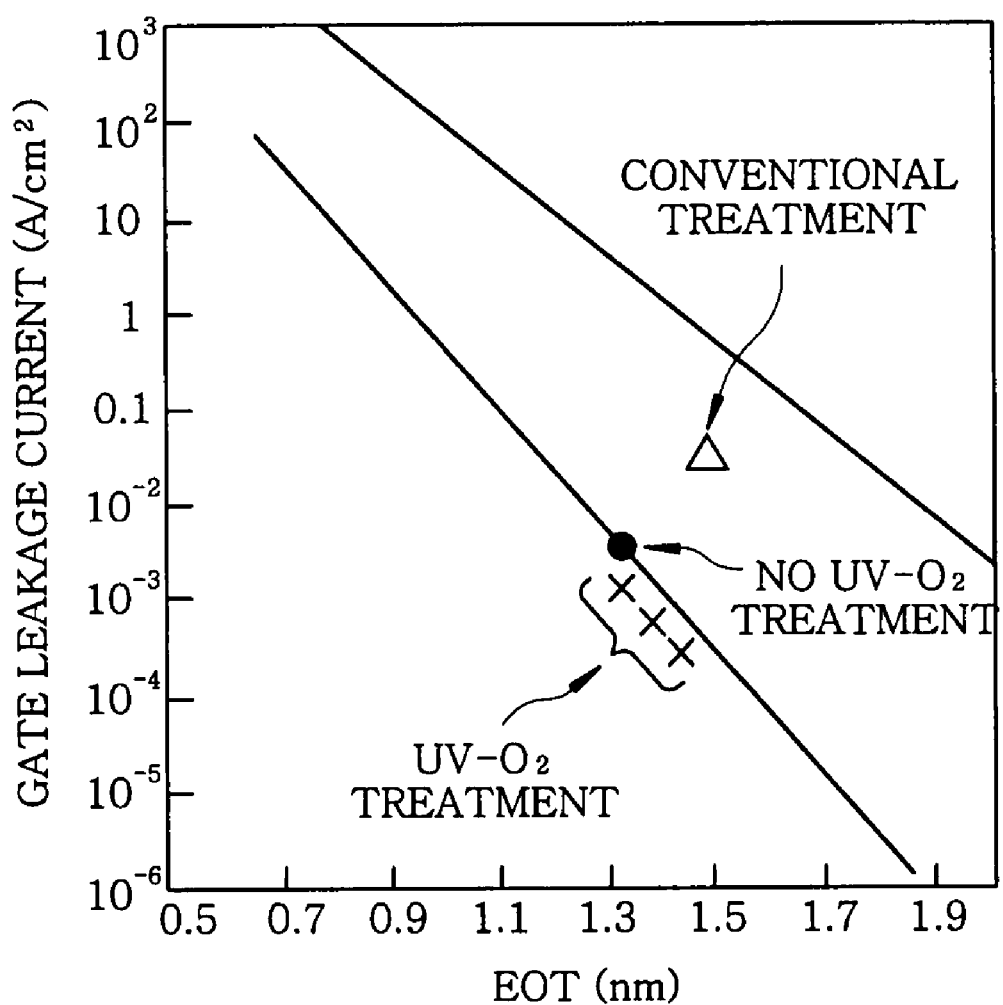
FIG. 12 is a graph illustrating a relationship between the EOT and the gate leakage current.

FIG. 12 is a graph illustrating a relationship between the EOT and the gate leakage current. Processes with/without the UV-$O_2$ processing as described in the second to seventh embodiments were evaluated. The result of conventional processing of oxygen radicals with a plasma is shown for comparison. The UV-$O_2$ processes with different processing times were performed three times. The EOT refers to the value obtained by converting a thickness of a gate insulating film into a thickness of a $SiO_2$ film, the gate insulating film being formed by laminating an $HfSiO_2$ film serving as a high-k dielectric thin film on a $SiO_2$ film serving as a base film. An excimer lamp emitting UV rays with a wavelength of 172 nm was used. The processing pressure in the UV-$O_2$ processing was set at 65 Pa or below so that UV attenuation caused by oxygen can be prevented. This is applied to FIGS. 13A to 14.

As apparent from FIG. 12, there is a large gate leakage current and the EOT is significantly increased in the conventional modification processing using oxygen radicals with a plasma. In contrast, in the UV-$O_2$ processing, the gate leakage current is suppressed as the processing time gets longer. It is because the carbon concentration is reduced by UV-$O_2$ processing and oxygen deficiency is compensated for. However, the EOT is increased as the processing time gets longer, which is not desirable. Further, since the oxygen radical concentration cannot be controlled by the conventional processing using oxygen radicals with a plasma, the concentration becomes excessively high. Therefore, the $SiO_2$ film serving as the base film gets thicker, which significantly increases the EOT of the gate insulating film. However, in the UV-$O_2$ processing of the present invention, the oxygen radical concentration can be controlled by adjusting the UV intensity or $O_2$ partial pressure and therefore the increase of the EOT can be suppressed.

Figure 13A:
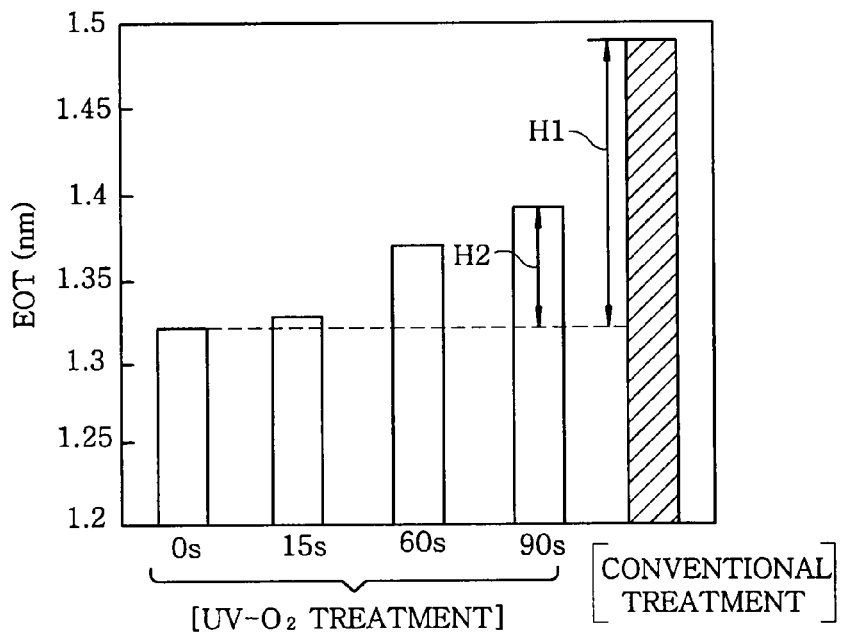
FIG. 13A is a graph describing a relationship between the $UV-O_2$ processing (wavelength: 172 nm) and the EOT.
Figure 13B:
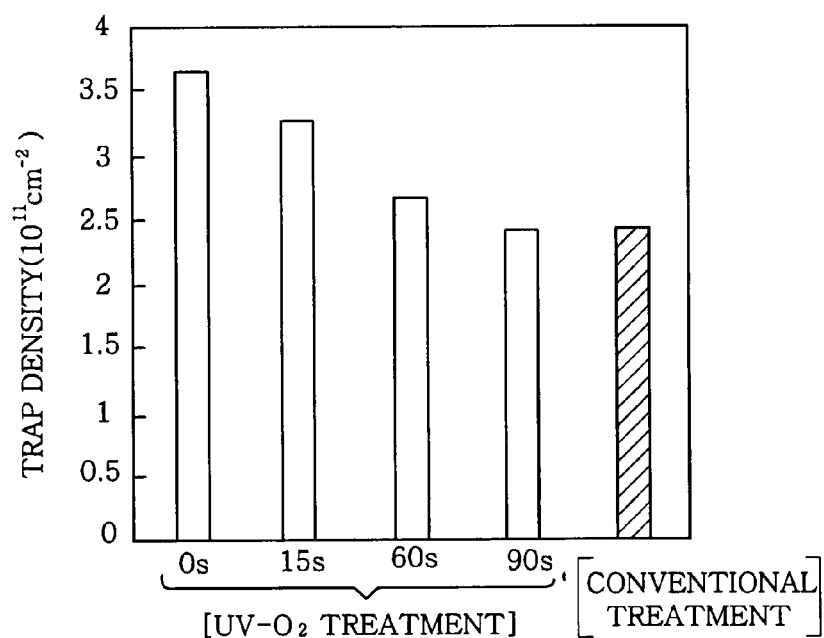
FIG. 13B is a graph describing a relationship between the $UV-O_2$ processing (wavelength: 172 nm) and the trap density.

FIGS. 13A and 13B are partly related to FIG. 12 and respectively show a relationship between the UV-$O_2$ processing (wavelength: 172 nm) and the EOT and a relationship between the UV-$O_2$ processing (wavelength: 172 nm) and the trap density. Here, the result of the conventional processing using oxygen radicals with a plasma is also shown for comparison. FIG. 13A shows a relationship between the UV-$O_2$ processing time and the EOT and FIG. 13B shows a relationship between the UV-$O_2$ processing time and the trap density. The UV-$O_2$ processing time varies from 0 to 90 seconds. Here, the processing time of the conventional processing using oxygen radicals with a plasma is 10 seconds. The UV-$O_2$ processing time of 0 seconds means no UV-$O_2$ processing.

In the conventional processing of oxygen radicals with a plasma shown in FIG. 13A, the film thickness increasing amount H1 from the film thickness in the 0 second processing is significant and is not desirable. On the contrary, in the UV-$O_2$ processing, although the EOT slightly increases as the processing time gets longer, the film thickness increasing amount H2 in 90 second processing is increased from the original film thickness of 1.32 nm only by 0.1 nm or less. Therefore, it shows that the UV-$O_2$ processing of the present invention can effectively suppress the increase in the EOT compared to the conventional processing of oxygen radicals with a plasma.

With respect to the trap density shown in FIG. 13B, the trap density in the conventional processing using oxygen radicals with a plasma is $2.5 \times 10^{11}$ cm$^{-2}$, which is quite satisfactory. On the other hand, as the processing time of the UV-$O_2$ processing gets longer, the trap density gets reduced and therefore becomes better. In 90 second processing, the trap density is almost equal to that of the conventional processing of oxygen radicals with a plasma. The reason that the trap density decreases as the processing time increases is that trap gets out of the film when carbon gets out of the film as the processing time passes by, whereby oxygen deficiency decreases.

Figure 14:
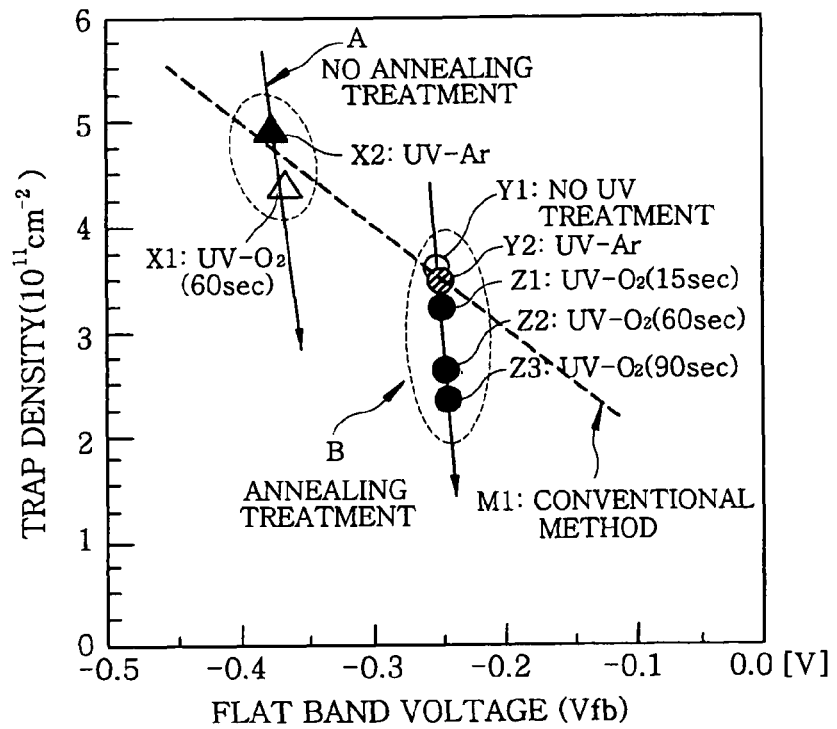
FIG. 14 is a graph showing an effect of $UV-O_2$ and UV-Ar processing on a relationship between the flat band voltage Vfb and the trap density.

Since FIGS. 13A and 13B are in a trade-off relationship with each other, the UV-$O_2$ processing time in practical application is determined depending on the target EOT or target trap density. FIG. 14 is a graph showing an effect of the UV-$O_2$ and UV-Ar processing on a relationship between the flat band voltage (Vfb) and the trap density. UV rays with a wavelength of 172 nm were applied.

The flat band voltage Vfb corresponds to a fixed charge amount in the gate insulating film, which has an effect on the critical voltage of the transistor. While the trap density and the flat band voltage do not have an independent relationship, they have a correlation as indicated by the straight line M1 in the conventional gate insulating film forming method.

Generally, in a manufacturing process of transistors, an annealing process follows a gate insulating film forming process. Since the trap density depends on the annealing time, the trap density gradually decreases as the processing time gets longer and therefore the flat band voltage approaches zero.

Here, there are a group A with no annealing process and a group B with an annealing process. In the group A, there are two examples: a case X1 with UV-$O_2$ processing for 60 seconds and a case X2 with UV-Ar processing. In the group B, there are a case Y1 with no UV processing, a case Y2 with UV-Ar processing and cases Z1, Z2 and Z3 with UV-$O_2$ processing for 15, 60 and 90 seconds, respectively.

In the conventional gate insulating film forming method, the trap density and the flat band voltage are adjusted depending on the annealing within the limit of the correlation indicated by the straight line M1.

On the other hand, the cases X1 and X2 in the group A and the cases Y1, Y2 and Z1 to Z3 in the group B are aligned in the vertical direction. In other words, the trap density can be selectively adjusted without change of the Vfb. With no relation to the annealing process, the trap density can be optionally controlled by the UV-$O_2$ or UV-Ar processing while the Vfb is not changed.

Modified Embodiments

Although hafnium (Hf) has been exemplified as refractory metal in the above-described embodiments, the present invention is not limited thereto. Tantalum (Ta), titanium (Ti), tungsten (W), zirconium (Zr) and the like may be used and their oxide and silicate of the oxide may be used for the high-k dielectric thin film.

In this case, metal organic compound materials including tantalum may be selected from t-butyl-iminotris(diethylamino)tantalum (TBTDET):[(NEt$_2$)$_3$TaN—Bu$^t$], pentakis(ethylmethylamino)tantalum (PEMAT): [Ta(NMeEt)$_5$], pentakis(dimethylamino)tantalum (PDMAT): [Ta(NMe$_2$)$_5$], pentakis(diethylamino)tantalum (PDEAT): [Ta(NEt$_2$)$_6$], t-butyl-iminotris(ethylmethylamino)tantalum (TBTMET): [(NEt$_2$Me)$_3$TaN—Bu$^t$], t-amyl-imidotris(dimethylamino)tantalum (TBTDMT): [(NMe$_2$)$_3$TaN—Bu$^t$] and t-amyl-imidotris(dimethylamino)tantalum (Taimata: product name): [(NMe$_2$)TaNC(CH$_3$)$_2$C$_2$H$_5$] (Ta(Nt-Am(NMe$_2$)$_3$).

Further, metal organic compound materials including titanium may be selected from tetrakis-diethylamino-titan (Ti[N(C$_2$H$_5$)$_2$]$_4$), tetrakis-dimethylamino-titan (Ti[N(CH$_3$)$_2$]$_4$) and tetrakis-ethylmethylamino-titan (Ti[N(CH$_3$)(C$_2$H$_5$)]$_4$).

Metal organic compound materials including tungsten may be selected from hexacarbonyl-tungsten (W(CO)$_6$) and bis-tert-butyl-imido-bis-dimethylamino-tungsten((t-Bu$^t$N)$_2$(Me$_2$N)$_2$W).

What is claimed is:

1. A method for modifying a high-k dielectric thin film formed on a surface of a target object by using metal organic compound materials, comprising:
   preparing the target object where the high-k dielectric thin film is formed on the surface; and
   modifying the high-k dielectric thin film by applying ultraviolet (UV) rays to the high-k dielectric thin film in an inert gas atmosphere while the target object is maintained at a predetermined temperature.

2. The method for modifying a high-k dielectric thin film according to claim 1, further comprising, before said modifying, a reoxidation process for compensating for oxygen deficiency of the high-k dielectric thin film by applying UV rays to the high-k dielectric thin film in an oxygen atmosphere while the target object is maintained at a predetermined temperature.

3. The method for modifying a high-k dielectric thin film according to claim 2, wherein, the processing pressure when the UV rays are applied to the high-k dielectric thin film in the oxygen atmosphere is in a range from 2.6 to 65 Pa.

4. The method for modifying a high-k dielectric thin film according to claim 1, further comprising, after said modifying, a reoxidation process for compensating for oxygen deficiency of the high-k dielectric thin film by applying UV rays to the high-k dielectric thin film in an oxygen atmosphere while the target object is maintained at a predetermined temperature.

5. The method for modifying a high-k dielectric thin film according to claim 4, wherein, the processing pressure when the UV rays are applied to the high-k dielectric thin film in the oxygen atmosphere is in a range from 2.6 to 65 Pa.

6. The method for modifying a high-k dielectric thin film according to claim 1, wherein the UV rays have a wavelength of 172 nm.

7. The method for modifying a high-k dielectric thin film according to claim 1, wherein a base film made of a $SiO_2$ film formed in an oxidation process is formed under the high-k dielectric thin film.

8. The method for modifying a high-k dielectric thin film according to claim 7, wherein the base film is formed in a base film forming process performed before a high-k dielectric thin film forming process for forming the high-k dielectric thin film on the surface of the target object.

9. The method for modifying a high-k dielectric thin film according to claim 2, wherein a base film made of a $SiO_2$ film is formed under the high-k dielectric thin film at the same time when the reoxidation process is performed.

10. The method for modifying a high-k dielectric thin film according to claim 1, wherein the predetermined temperature in said modifying is in a temperature range for maintaining oxygen bonds in the high-k dielectric thin film.

11. The method for modifying a high-k dielectric thin film according to claim 10, wherein the predetermined temperature in said modifying is 500° C. or below.

12. The method for modifying a high-k dielectric thin film according to claim 1, wherein the high-k dielectric thin film is formed of a refractory metal oxide or its silicate.

13. The method for modifying a high-k dielectric thin film according to claim 12, wherein the refractory metal is one of Hf, Ta, Ti, W and Zr.

14. The method for modifying a high-k dielectric thin film according to claim 1, further comprising: after said modifying, a nitridation process for nitriding the surface of the high-k dielectric thin film.

15. The method for modifying a high-k dielectric thin film according to claim 1, further comprising: before said modifying, a nitridation process for nitriding the surface of the high-k dielectric thin film.

16. The method for modifying a high-k dielectric thin film according to claim 1, wherein the high-k dielectric thin film serves as a gate insulating film of a transistor.

17. The method for modifying a high-k dielectric thin film according to claim 1, wherein the inert gas includes at least one of $N_2$, He, Ar, Ne, Kr and Xe.

18. The method for modifying a high-k dielectric thin film according to claim 4, wherein a base film made of a $SiO_2$ film is formed under the high-k dielectric thin film at the same time when the reoxidation process is performed.

19. A method for modifying a high-k dielectric thin film formed on a surface of a target object by using metal organic compound materials, comprising:
   preparing the target object where the high-k dielectric thin film is formed on the surface; and
   modifying the high-k dielectric thin film by applying ultraviolet (UV) rays to the high-k dielectric thin film in an oxygen atmosphere while the target object is maintained at a predetermined temperature.

20. The method for modifying a high-k dielectric thin film according to claim 19, wherein, the processing pressure when the UV rays are applied to the high-k dielectric thin film in the oxygen atmosphere is in a range from 2.6 to 65 Pa.

* * * * *

UNITED STATES PATENT AND TRADEMARK OFFICE
CERTIFICATE OF CORRECTION

| | |
|---|---|
| PATENT NO. | : 7,867,920 B2 |
| APPLICATION NO. | : 12/097888 |
| DATED | : January 11, 2011 |
| INVENTOR(S) | : Kazuyoshi Yamazaki et al. |

It is certified that error appears in the above-identified patent and that said Letters Patent is hereby corrected as shown below:

Column 18, line 11, "500°C. or below", should be --500°C or below--;

Column 18, line 31, "N2" should be --$N_2$--; and

Column 18, line 33, "Si0$_2$" should be --$SiO_2$--.

Signed and Sealed this
Tenth Day of May, 2011

David J. Kappos
*Director of the United States Patent and Trademark Office*